US007795833B2

(12) United States Patent
Sekiguchi

(10) Patent No.: US 7,795,833 B2
(45) Date of Patent: Sep. 14, 2010

(54) DRIVING APPARATUS, EXPOSURE APPARATUS, AND DEVICE MANUFACTURING METHOD

(75) Inventor: Hiroyuki Sekiguchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 143 days.

(21) Appl. No.: 12/015,673

(22) Filed: Jan. 17, 2008

(65) Prior Publication Data

US 2008/0122395 A1 May 29, 2008

Related U.S. Application Data

(60) Continuation of application No. 11/690,216, filed on Mar. 23, 2007, now Pat. No. 7,385,370, which is a division of application No. 11/031,021, filed on Jan. 10, 2005, now Pat. No. 7,215,095.

(30) Foreign Application Priority Data

Jan. 15, 2004 (JP) .............................. 2004-008404

(51) Int. Cl.
*G05B 19/33* (2006.01)
(52) U.S. Cl. ..................... 318/575; 318/560; 318/567; 318/625; 318/687
(58) Field of Classification Search ................. 318/575, 318/560, 567, 625, 687
See application file for complete search history.

(56) References Cited

U.S. PATENT DOCUMENTS

| 3,886,421 A | 5/1975 | Hassan et al. ............... 318/593 |
| 3,904,945 A | 9/1975 | Hassan et al. ............... 318/593 |
| 4,016,396 A | 4/1977 | Hassan et al. ......... 219/121 EB |
| 5,172,160 A | 12/1992 | Van Eijk et al. ............... 355/53 |
| 5,260,580 A | 11/1993 | Itoh et al. ................. 250/492.2 |
| 5,446,519 A | 8/1995 | Makinouchi ................. 355/53 |

(Continued)

FOREIGN PATENT DOCUMENTS

EP 0 557 100 A1 8/1993

(Continued)

OTHER PUBLICATIONS

Extended European Search Report dated Feb. 4, 2009, mailed in a Communication dated Feb. 13, 2009, in copending European patent application No. 05 25 0112.

(Continued)

*Primary Examiner*—Bentsu Ro
*Assistant Examiner*—David S Luo
(74) *Attorney, Agent, or Firm*—Fitzpatrick, Cella, Harper & Scinto

(57) ABSTRACT

A driving apparatus for moving an object. The apparatus includes a first actuator which drives the object in X and Y directions, a second actuator which drives a reaction force counter, which receives a reaction force generated when the first actuator drives the object, and a controller which calculates X- and Y-direction reaction forces and a moment reaction force on the basis of X- and Y-direction positions of the object and X- and Y-direction accelerations of the object, which are to be received by the reaction force counter when the object is driven by the first actuator, and controls the second actuator so as to cancel the reaction forces and the moment reaction force.

7 Claims, 9 Drawing Sheets

U.S. PATENT DOCUMENTS

| | | | |
|---|---|---|---|
| 5,684,856 A | 11/1997 | Itoh et al. | 378/34 |
| 5,744,924 A | 4/1998 | Lee | 318/568.17 |
| 5,838,443 A | 11/1998 | Sekiguchi | 356/363 |
| 6,025,688 A | 2/2000 | Sekiguchi | 318/610 |
| 6,028,376 A * | 2/2000 | Osanai et al. | 310/12.13 |
| 6,072,183 A | 6/2000 | Itoh et al. | 250/492.2 |
| 6,359,679 B1 | 3/2002 | Ito et al. | 355/75 |
| 6,392,741 B1 | 5/2002 | Mori et al. | 355/53 |
| 6,400,117 B2 | 6/2002 | Okazaki | 318/687 |
| 6,504,160 B2 | 1/2003 | Itoh et al. | 250/442.11 |
| 6,570,645 B2 | 5/2003 | Korenaga et al. | 355/75 |
| 6,593,997 B1 | 7/2003 | Watson et al. | 355/53 |
| 6,654,098 B2 | 11/2003 | Asano et al. | 355/53 |
| 6,717,653 B2 | 4/2004 | Iwamoto et al. | 355/72 |
| 6,844,694 B2 | 1/2005 | Binnard | 318/649 |
| 6,891,597 B2 | 5/2005 | Sekiguchi | 355/53 |
| 6,927,838 B2 | 8/2005 | Ono et al. | 355/72 |
| 2001/0045526 A1 | 11/2001 | Itoh et al. | 250/492.2 |
| 2003/0139044 A1 | 7/2003 | Takeishi | |
| 2003/0197850 A1 | 10/2003 | Sekiguchi | 355/72 |

FOREIGN PATENT DOCUMENTS

| | | |
|---|---|---|
| EP | 1 357 432 A2 | 10/2003 |
| JP | 5-77126 | 3/1993 |
| JP | 5-121294 | 5/1993 |
| JP | 10-149974 A | 6/1998 |
| JP | 2001-217172 A | 8/2001 |
| JP | 2003-209047 A | 7/2003 |
| JP | 2003-318082 | 11/2003 |

OTHER PUBLICATIONS

Japanese Office Action dated May 7, 2010, which issued in counterpart Japanese patent application No. 2004-008404, with an English translation.

* cited by examiner

DRIVING APPARATUS, EXPOSURE APPARATUS, AND DEVICE MANUFACTURING METHOD

This application is a continuation of U.S. patent application Ser. No. 11/690,216, filed Mar. 23, 2007, which is a divisional application of U.S. patent application Ser. No. 11/031,021, filed on Jan. 10, 2005, now issued as U.S. Pat. No. 7,215,095 on May 8, 2007.

This application also claims priority from Japanese Patent Application No. 2004-008404, filed on Jan. 15, 2004, the entire contents of which are hereby incorporated by reference herein.

FIELD OF THE INVENTION

The present invention relates to a driving apparatus, an exposure apparatus, and a device manufacturing method and, more particularly, to a driving apparatus for moving an object such as a substrate, a chuck, and a stage (top plate), an exposure apparatus having the driving apparatus, and a device manufacturing method using the exposure apparatus.

BACKGROUND OF THE INVENTION

A typical example of an exposure apparatus used to manufacture a device, such as a semiconductor device, includes a step and repeat exposure apparatus (stepper), which sequentially exposes the pattern of a master (reticle or mask) onto a plurality of exposure regions on a substrate (e.g., a wafer or glass substrate) through a projection optical system while stepping the substrate, and a step and scan type exposure apparatus (scanner), which repeats stepping and scanning exposure to repeat exposures and transfer onto the plurality of regions on a substrate. In particular, the step and scan type exposure apparatus uses exposure light after limiting it with a slit to a component comparatively close to the optical axis of a projection optical system, so that it can expose a micropattern at a higher accuracy with a wider angle of view. Some exposure apparatuses draw a pattern on a substrate with an electrosensitive particle beam, such as an electron beam or ion beam, in place of light.

Each of the exposure apparatuses has a stage device or driving apparatus (wafer stage or reticle stage), which aligns a wafer or reticle by moving it at high speed. In such an exposure apparatus, when the stage is driven, a reaction force of an inertia force accompanying acceleration and deceleration is generated. When the reaction force is transmitted to a stage surface plate on which the stage is mounted, the stage surface may swing or vibrate. Such vibration induces characteristic vibration of the mechanism system of the exposure apparatus to generate high-frequency vibration, which may interfere with faster, higher-accuracy alignment.

To solve the problems relating to the reaction force, several proposals have been made. For example, according to the apparatus described in Japanese Patent Laid-Open No. 5-77126, the stator of a linear motor, which drives a stage, is supported on the floor independently of a stage surface plate, so that swing of the stage surface plate caused by the reaction force is prevented. According to the apparatus described in Japanese Patent Laid-Open No. 5-121204, a machine frame supports a wafer stage and a projection lens. An actuator, which generates a force in the horizontal direction, applies to the machine frame a compensating force equivalent to a reaction force accompanying the drive of the stage. Swing of the apparatus caused by the reaction force is thus decreased.

In any of the conventional examples described above, although the swing of the stage apparatus itself can be decreased, the reaction force accompanying the drive of the stage is transmitted to the floor directly or through a member that can be substantially regarded as being integral with the floor. This may oscillate the floor and vibrate devices set around the exposure apparatus, thus, adversely affecting the peripheral devices. Usually, the floor where the exposure apparatus is installed has a natural frequency of about 20 Hz to about 40 Hz. As the exposure apparatus is operated, when the characteristic vibration of the floor is induced, it adversely largely affects the peripheral devices.

Recently, as the processing speed (throughput) increases, the stage acceleration increases more and more. For example, in a step and scan type exposure apparatus, the maximum acceleration of the stage reaches a gravitational force as high as 4 G in the reticle stage and a gravitational force of 1 G in the wafer stage. As the reticle or substrate increases in size, the stage mass also increases. Therefore, the driving force defined by <mass of a moving object>×<acceleration> becomes very large, and its reaction force is enormous. As the reaction force increases in this manner, oscillation of the floor for installation caused by the reaction force has become a non-negligible issue.

The size of the apparatus also increases largely, and in a manufacturing factory where many manufacturing apparatuses are installed, an increase in an area occupied by the apparatuses is becoming an apparent issue. More specifically, when the vibration transmitted from one apparatus to the floor is large, to prevent the other apparatuses from being influenced by the vibration, the distances among the apparatuses must be increased, and finally, the area actually occupied by the respective apparatuses increases.

Japanese Patent Laid-Open No. 2003-318082 discloses, in a driving apparatus which drives an object by a linear motor, use of the stator of the linear motor as a reaction force counter. According to the driving apparatus described in this document, when an object which stays still at the first position is to be moved to the second position and to be set still, the linear motor is controlled so that the object moves along a straight line connecting the first and second positions, to cancel a moment reaction force accompanying acceleration and deceleration of the object.

According to the technique described in Japanese Patent Laid-Open No. 2003-318082, the wafer stage must be moved along a straight line. In the step & scan type exposure apparatus, assume that the entire moving path of a wafer stage to sequentially expose a plurality of exposure regions S is formed of straight lines, as shown in FIG. 5. The wafer stage must be stopped at the terminal point of each straight line. This can interfere with an increase in throughput. In view of this, a process to sequentially expose the plurality of exposure regions S while continuously driving the wafer stage along a smooth curved line, as exemplified in FIG. 6, is sought.

To continuously move the wafer stage along the smooth curved lines, moderation of the limit for a Y-direction (X-direction) driving pattern by an X-direction (Y-direction) driving pattern (driving profile) is sought.

The present invention has been made on the basis of the recognition of the above problems, and has as its object to provide a technique that can cancel a reaction force accompanying drive of an object while moderating a limit for a driving pattern to drive the object in X and Y directions.

According to one aspect of the present invention, there is provided a driving apparatus, for moving an object, comprising a first actuator which drives the object in X and Y directions, a second actuator which drives a reaction force counter, which receives a reaction force generated when the first actuator drives the object, and a controller which controls the second actuator on the basis of X- and Y-direction positions of the object so as to cancel, by the second actuator, the reaction force to be received by the reaction force counter when the object is driven by the first actuator.

According to a preferred embodiment of the present invention, for example, the controller calculates X- and Y-direction accelerations of the object on the basis of the X- and Y-direction positions of the object, and controls the second actuator on the basis of the X- and Y-direction positions of the object and the X- and Y-direction accelerations of the object. Alternatively, the driving apparatus can further comprise an acceleration sensor, which detects X- and Y-direction accelerations of the object. The controller can control the second actuator on the basis of the X- and Y-direction accelerations of the object from the acceleration sensor and the X- and Y-direction positions of the object.

According to a preferred embodiment of the present invention, for example, the controller controls the second actuator so as to cancel, by the second actuator, X- and Y-direction reaction forces and a moment reaction force, which are to be received by the reaction force counter when the object is driven by the first actuator.

According to a preferred embodiment of the present invention, for example, the controller calculates X- and Y-direction reaction forces and a moment reaction force, which are to be received by the reaction force counter when the object is driven by the first actuator, and generates a profile to drive the reaction force counter on the basis of the X- and Y-direction reaction forces and the moment reaction force.

According to a preferred embodiment of the present invention, for example, the controller calculates the X- and Y-direction reaction forces Fx and Fy to be received by the reaction force counter and the moment reaction force Fr in accordance with:

$$Fx = m \cdot AccX$$

$$Fy = m \cdot AccY, \text{ and}$$

$$Fr = y \cdot Fx - x \cdot Fy = m(y \cdot AccX - x \cdot AccY)$$

where m, x, and y are a weight, X-direction position, and Y-direction position, respectively, of the object, and AccX and AccY are X- and Y-direction accelerations, respectively. The controller generates a profile to drive the reaction force counter such that $\Sigma(FMx) = -Fx$, $\Sigma(FMy) = -Fy$, and $\Sigma(FMr) + -Fr$ are established, such that $\Sigma(FMx)$ and $\Sigma(FMy)$ are sums of X- and Y-direction thrusts, respectively, of the second actuator, and $\Sigma(FMr)$ is a sum of moment thrusts. For example, the profile can comprise a profile that provides a thrust command value.

According to a preferred embodiment of the present invention, for example, the controller generates a profile to drive the second actuator such that $\Sigma(M(i) \cdot AccMX(i)) = -Fx$, $\Sigma(M(i) \cdot AccMY(i)) = -Fy$, and $\Sigma(J(i) \cdot AccMJ(i)) = Fr$ are established, where (M(i)) is a weight of each of a plurality of reaction counters which receive the reaction force generated when the first actuator drives the object, AccMX(i) and AccMY(i) are, respectively, X- and Y-direction acceleration of each of the plurality of reaction force counters, and J(i) and AccMJ(i) are, respectively, a moment of inertia and an angular acceleration of each of the plurality of reaction force counters. For example, the profile can comprise a profile that provides an acceleration command value. For example, the controller can convert the acceleration command value into a speed command value and control the second actuator with the speed command value, or convert the acceleration command value into a position command value and control the second actuator with the position command value.

According to a preferred embodiment of the present invention, the reaction force counter can include a stator of the first actuator.

According to a preferred embodiment of the present invention, for example, the controller controls the second actuator to gradually decelerate the reaction force counter when a speed of the reaction force counter is not zero while a speed of the object is zero.

According to the second aspect of the present invention, there is provided an exposure apparatus, which has a chuck and transfers or draws a pattern onto a substrate chucked on the chuck, and in which the chuck can be driven by the driving apparatus described above.

According to the third aspect of the present invention, there is provided a device manufacturing method of manufacturing a device by using an exposure apparatus described above.

According to the present invention, for example, a reaction force accompanying drive of an object can be canceled while moderating the limit for a driving pattern to drive the object in the X and Y directions.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

First Embodiment

Figure 4A:
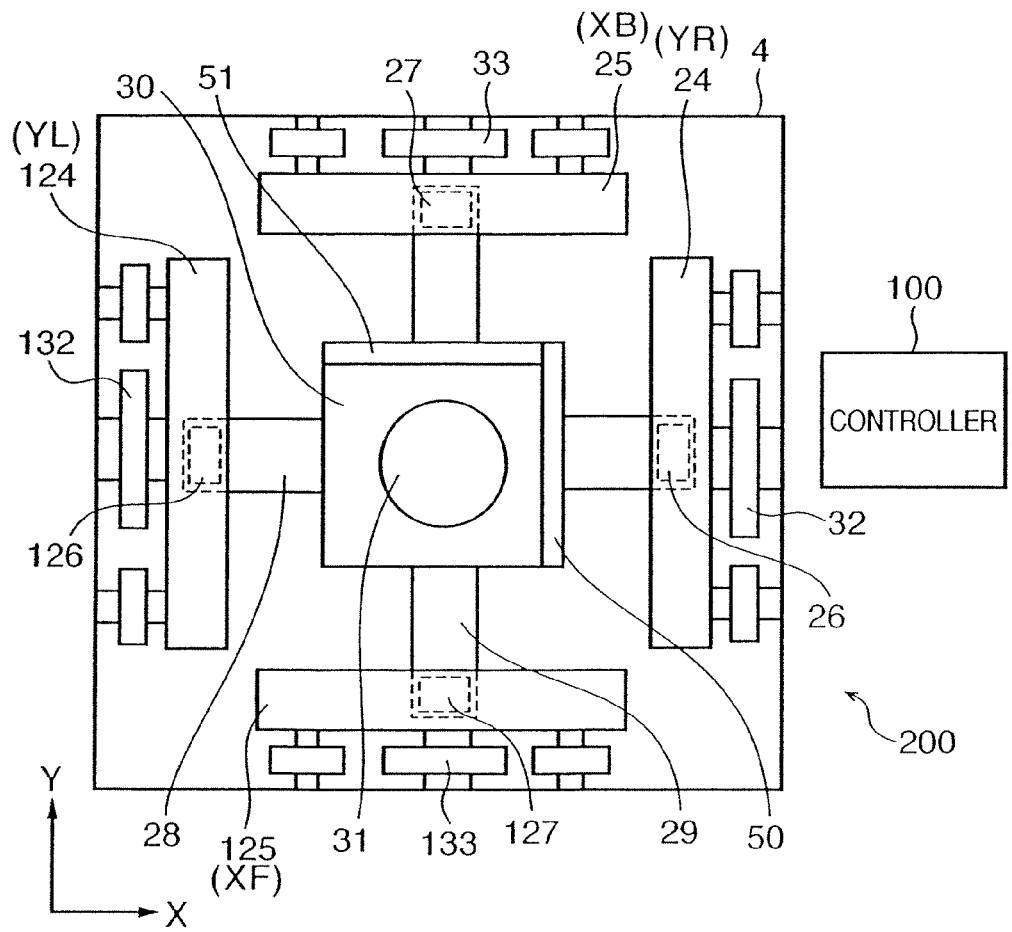
FIGS. 4A and 4B are views showing the schematic arrangement of a driving apparatus (wafer stage) built into an exposure apparatus according to a preferred embodiment of the present invention.
Figure 4B:
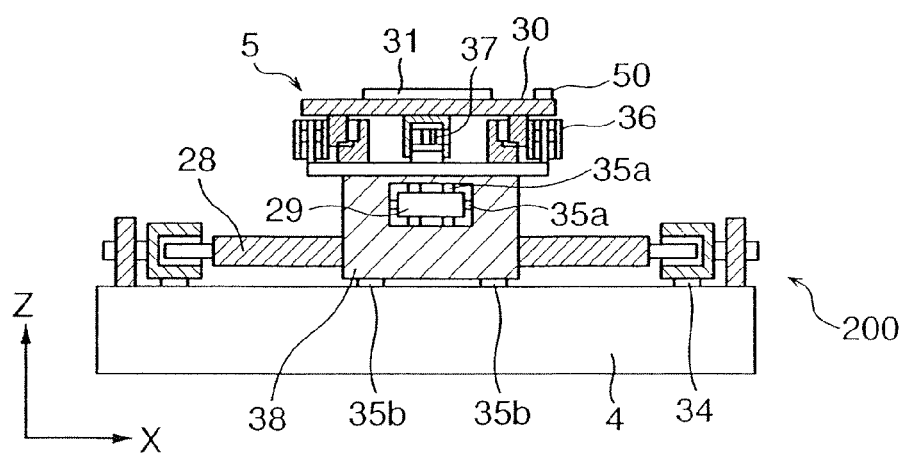
Figure 5:
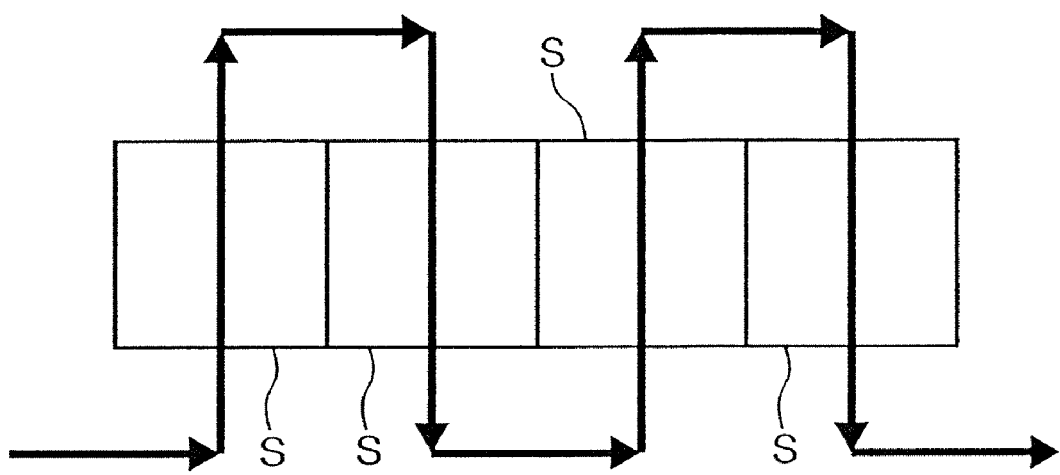
FIG. 5 is a view showing a stage driving example that can cancel a reaction force completely with an apparatus described in Japanese Patent Laid-Open No. 2003-318082.

FIGS. 4A and 4B show the schematic arrangement of a driving apparatus (wafer stage) built into an exposure apparatus according to a preferred embodiment of the present invention, in which FIG. 4A is a plan view, and FIG. 4B is a sectional view.

Referring to FIGS. 4A and 4B, a top plate 30 is provided with a wafer chuck 31 and bar mirrors 50 and 51 for position measurement. The wafer chuck 31 chucks and holds a wafer (substrate) as a positioning target by a chucking method such as vacuum suction or electrostatic attraction. The bar mirrors 50 and 51 reflect measurement light from laser interferometers (not shown). The top plate 30 is levitated in a non-contact manner with respect to an X-Y slider 38 by a self weight compensator (not shown) utilizing a magnet, and can move in six-axis directions. The top plate 30 is finely driven in the six-axis directions (X, Y, and Z directions and directions about the X-, Y- and Z-axes) by actuators, which generate driving forces between the top plate 30 and X-Y slider 38. As the actuators for the six-axis fine driving, two X-direction linear motors, one Y-direction linear motor, and three Z-direction linear motors, are provided. When the two X-direction fine-moving linear motors are driven in opposite directions, the top plate 30 can be driven about the Z-axis (θdirection). When the driving forces of the three Z-direction fine-moving linear motors are adjusted, the top plate 30 can be driven about the X-axis (ωX direction) and Y-axis (ωY direction). Coils serving as the stators of the fine-moving linear motors are provided to the X-Y slider 38, and permanent magnets serving as the movable elements of the fine-moving linear motors are provided to the top plate 30.

The X-Y slider 38 is guided in the X and Y directions by an X-guide bar 28 and a Y-guide bar 29 through air bearings (hydrostatic bearings) 35a. The X-Y slider 38 is guided in the Z direction by the upper surface of a reference structure 4 through air bearings (hydrostatic bearings) 35b.

Movable elements (magnets) 26 and 126, and 27 and 127, of the linear motors (first actuators), are attached near the two ends of the X-guide bar 28 and near the two ends of the Y-guide bar 29, respectively. Under the control of a controller 100, when a current is supplied to two X linear motors (coils) 24 and 124 and two Y linear motors (coils) 25 and 125, the Lorentz force is generated, and the X-guide bar 28 and Y-guide bar 29 can be driven in the Y and X directions, respectively. The two X linear motors (coils) 24 and 124 and the two Y linear motors (coils) 25 and 125 are guided in the Z direction by the upper surface of the reference structure 4 through air bearings (hydrostatic bearings) 34, and can freely move in the X and Y directions (planar direction). In the following description, the linear motor stators 24, 124, 25, and 125 are also respectively referred to as YR, YL, XB, and XF.

Under the control of the controller 100, the linear motor stators 24 and 124 are driven in the Y direction by linear motor stator control linear motors (second actuators) 32 and 132. Similarly, the linear motor stators 25 and 125 are driven in the X direction by linear motor stator control linear motors (second actuators) 33 and 133.

In the driving apparatus shown in FIGS. 4A and 4B, the reaction force counter formed of the stators of the linear motors is divided into four centers XB (25), XF (125), YR (24), and YL (124).

A driving reaction force generated when the X-Y slider 38 is driven in the X direction can be canceled by the reaction force counters XB (25) and XF (125). More specifically, assume that the X-direction component of a driving force F(t) of the X-Y slider 38, expressed as $F_x(t)$, $F_x(t)$, is a driving force that drives the movable elements 27 and 127 of the X linear motors, and its reaction force is $-F_x(t)$. The X-direction reaction force $-F_x(t)$ is received by the reaction force counter XB (25) and XF (125), formed of the stators of the X-direction linear motors. The X-direction reaction force can be canceled if equation (1) is established:

$$F_x(t) = -(F_{XF}(t) + F_{XB}(t)) \tag{1}$$

where $F_{XF}(t)$ is a force acting on the reaction force counter XF (125) and $F_{XB}(t)$ is a force acting on the reaction force counter XB (25).

Similarly, a Y-direction driving reaction force can be canceled by the reaction force counters YL (124) and YR (24). More specifically, assume that the Y-direction component of the driving force F(t) of the X-Y slider 38, expressed as $F_y(t)$, $F_y(t)$, is a driving force that drives the movable elements 26 and 126 of the Y linear motors, and its reaction force is $-F_y(t)$. The Y-direction reaction force $-F_y(t)$ is received by the reaction force counter YL (126) and YR (26) formed of the stators of the Y linear motors. The Y-direction reaction force can be canceled if equation (2) is established:

$$F_y(t) = -(F_{YL}(t) + F_{YR}(t)) \tag{2}$$

where $F_{YL}(t)$ is a force acting on the reaction force counter YL and $F_{YR}(t)$ is a force acting on the reaction force counter YR.

Figure 7:
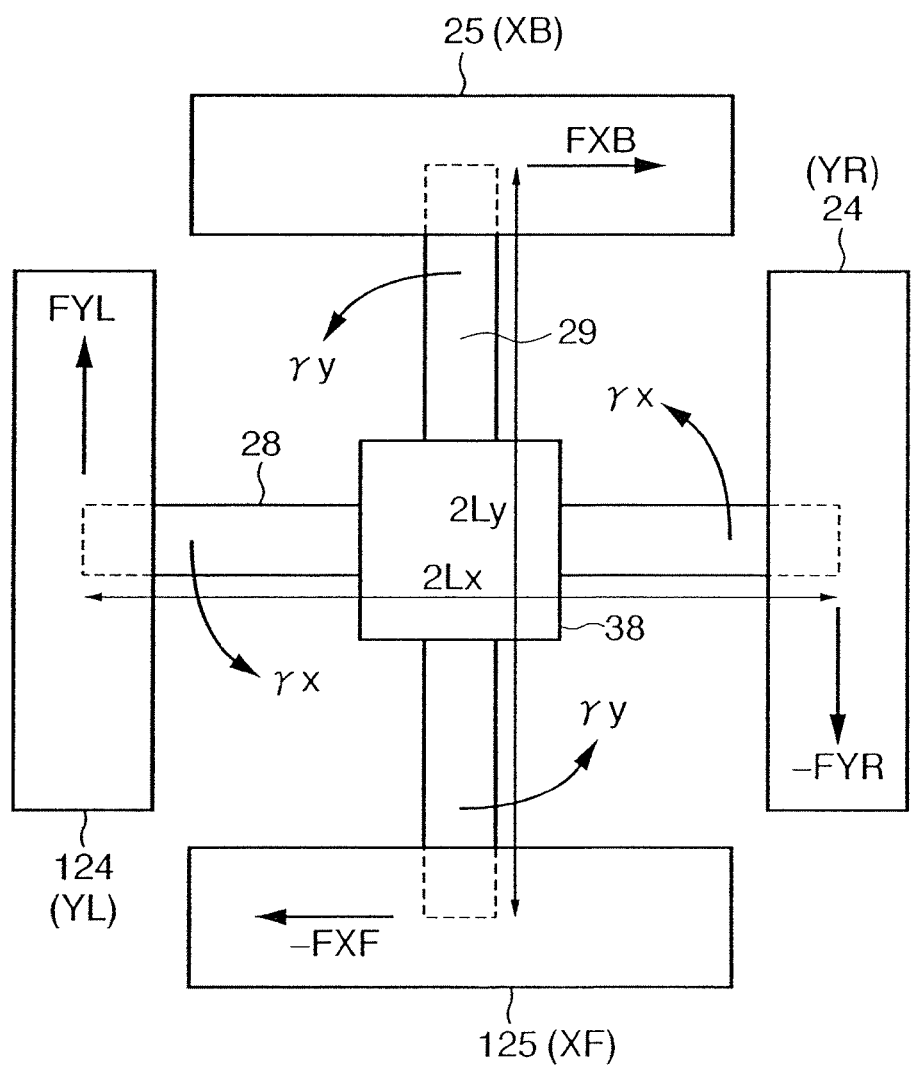
FIG. 7 is a view for explaining a moment reaction force.

A moment-direction reaction force (reaction force of rotation) will be considered. FIG. 7 shows a reaction force in the direction of a moment in the driving apparatus shown in FIGS. 4A and 4B. A moment reaction force $\gamma_x(t)$ acting on the X-guide bar 28 from the X-Y slider 38 can be expressed by the following equation (3):

$$\gamma_x(t) = y(t) \cdot m \cdot AccX(t) \tag{3}$$

where x(t) and y(t) are the X- and Y-direction positions of the X-Y slider 38 with respect to the barycenter of the entire driving apparatus as the center, m is the weight of the X-Y slider 38, and AccX(t) and AccY(t) are respectively the X- and Y-direction accelerations of the X-Y slider 38.

A moment reaction force $\gamma_y(t)$ acting on the Y-guide bar 29 from the X-Y slider 38 can be expressed by the following equation (4):

$$\gamma_x(t) = x(t) \cdot m \cdot AccY(t) \tag{4}$$

A moment reaction force γ(t) is the sum of the moment $\gamma_x(t)$ acting on the X-guide bar 28 and the moment $\gamma_y(t)$ acting on the Y-guide bar 29, and is accordingly expressed by the following equation (5):

$$\gamma(t)=m(y(t)\cdot AccX(t)-x(t)\cdot AccY(t)) \quad (5)$$

Assuming that the lengths of the X- and Y-guide bars 28 and 29 are, respectively, 2Lx and 2Ly, as is apparent from FIG. 7, the moment reaction forces $\gamma_x(t)$ and $\gamma_y(t)$, respectively, acting on the guide bars 28 and 29 from the counter masses XF and XB, and YL and YR can be expressed by the following equations (6):

$$\gamma_x(t)=-(F_{YL}(t)-F_{YR}(t))L_X$$

$$\gamma_y(t)=-(F_{XB}(t)-F_{XF}(t))L_Y \quad (6)$$

Similarly, the moment reaction force $\gamma(t)$ is the sum of the moment $\gamma_x(t)$ acting on the X-guide bar 28 and the moment $\gamma_y(t)$ acting on the Y-guide bar 29, if the following equation (7):

$$\begin{aligned}\gamma(t) &= \gamma_x(t) + \gamma_y(t) \\ &= (F_{YL}(t) - F_{YR}(t))L_X - (F_{XB}(t) - F_{XF}(t))L_y\end{aligned} \quad (7)$$

is established, then the moment reaction force can be canceled.

In this driving apparatus under the control of the controller 100, the X-Y slider 38 is driven, and, simultaneously, the reaction force counters XF (125), XB (25), YL (124), and YR (24) formed of the linear motor stators are driven by the linear motor stator control linear motors 133, 33, 132, and 32 by forces expressed by the following equations (8):

$$F_{XF}(t)=-(F_x(t)-\gamma(t)\alpha)/2$$

$$F_{XB}(t)=-(F_x(t)-\gamma(t)\alpha)/2$$

$$F_{YL}(t)=-(F_y(t)-\gamma(t)\beta)/2$$

$$F_{YR}(t)=-(F_y(t)-\gamma(t)\beta)/2 \quad (8)$$

When the reaction force counters XF (125), XB (25), YL (124), and YR (24) are driven by the forces expressed by equations (8), equation (1) is established for the forces acting in the X direction on the reaction force counters XF (125) and XB (25), as shown in the following equation (9):

$$-(F_{XF}(t)+F_{XB}(t))=F_x(t). \quad (9)$$

Accordingly, the reaction force in the X direction can be canceled completely.

Similarly, equation (2) is established in the Y direction, as shown in the following equation (10):

$$-(F_{YL}(t)+F_{YR}(t))=F_y(t). \quad (10)$$

Accordingly, the reaction force in the Y direction can be canceled completely.

Furthermore, the moment reaction force is as shown in the following equation (11):

$$-(F_{YL}(t)-F_{YR}(t))L_x-(F_{XB}(t)-F_{XF}(t)-F_{XF}(t))L_y=(\beta L_x+\alpha L_y)\gamma(t). \quad (11)$$

Accordingly, if $\alpha$ and $\beta$ that establish the following equation (12):

$$\beta L_x+\alpha L_y=1 \quad (12)$$

are selected, then equation (7) is established and the moment reaction force can be canceled completely.

For example, if $\alpha$ and $\beta$ are determined in accordance with the following equations (13):

$$\alpha=1/(2L_y)$$

$$\beta=1/(2L_x) \quad (13)$$

then, the moment reaction force can be distributed into the four reaction force counters XF, XB, YL, and YR.

The driving profiles with which the linear motor stator control linear motors 133, 33, 132, and 32, respectively, drive the reaction force counters XF (125), XB (25), YL (124), and YR (24) can be calculated in real time by the controller 100 when necessary on the basis of the accelerations and positions in the X and Y directions of the X-Y slider 38.

Equations (8) can be written into the following equations (14):

$$AccXF=-(m\cdot AccX-\gamma\alpha)/(2MXF)$$

$$AccXB=-(m\cdot AccX-\gamma\alpha)/(2MXB)$$

$$AccYL=-(m\cdot AccY-\gamma\beta)/(2MYL)$$

$$AccYR=-(m\cdot AccY-\gamma\beta)/(2MYR)$$

$$\gamma=m(y\cdot AccX-x\cdot AccY) \quad (14)$$

where MXF and AccXF are the weight and acceleration, respectively, of the reaction force counter XF, MXB and AccXB are the weight and acceleration, respectively, of the reaction force counter XB, MYL and AccYL are the weight and acceleration, respectively, of the reaction force counter YL, and MYR and AccYR are the weight and acceleration, respectively, of the reaction force counter YR.

In this manner, acceleration command values that can be supplied to the linear motor stator control linear motors 133, 33, 132, and 32 to accelerate the reaction force counters XF, XB, YL, and YR, respectively, can be determined on the basis of the accelerations AccX and AccY and positions x and y of the X-Y slider 38.

Figure 1:
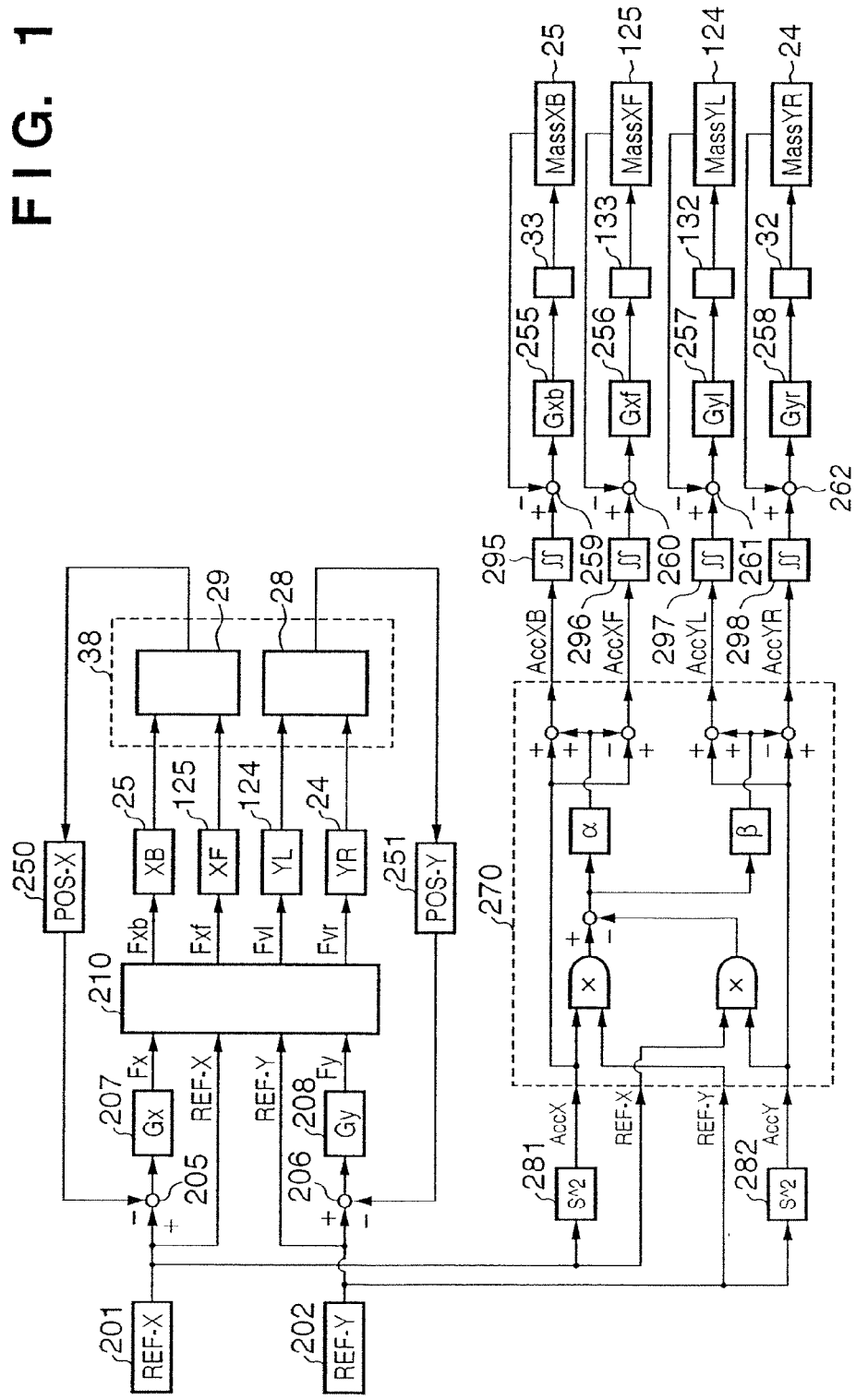
FIG. 1 is a block diagram showing an arrangement of a controller which controls a driving apparatus.

FIG. 1 is a block diagram showing an arrangement of the controller 100. Referring to FIG. 1, an X-position command unit 201 generates a command value REF-X, which instructs the X-direction target position of the X-Y slider 38 in accordance with the X-direction position profile. A Y-position command unit 202 generates a command value REF-Y, which instructs the Y-direction target position of the X-Y slider 38 in accordance with the Y-direction position profile. The controller 100 shown in FIG. 1 forms a position feedback servo system that moves the X-Y slider 38 in accordance with the X- and Y-direction position command values REF-X and REF-Y generated by the X- and Y-position command units 201 and 202, respectively.

The X- and Y-direction positions of the X-Y slider 38 are controlled by driving the Y- and X-guide bars 29 and 28 in the X and Y directions, respectively. The Y-guide bar 29 is driven by the linear motors XB (25) and XF (125). The X-guide bar 28 is driven by the linear motors YL (124) and YR (24).

An X-position measurement unit 250 measures the X-direction position of the X-Y slider 38, and a Y-position measurement unit 251 measures the Y-direction position of the X-Y slider 38. The X- and Y-position measurement units 250 and 251 can respectively include laser interferometers which measure the positions of the X and Y bar mirrors 50 and 51, respectively, shown in FIGS. 4A and 4B.

A subtracter 205 subtracts the X-direction measurement position provided by the X-position measurement unit 250 from the X-direction target position command value REF-X provided by the X-position command unit 201, and outputs an X-direction position deviation (control deviation). The position deviation is converted into an X-axis thrust command value Fx by an X-axis compensator (Gx) 207. The compensator (Gx) 207 can include a PID compensator, a low-pass filter, a notch filter, and the like.

A subtracter 206 subtracts the Y-direction measurement position provided by the Y-position measurement unit 251 from the Y-direction target position command value REF-Y provided by the Y-position command unit 202, and outputs a Y-direction position deviation (control deviation). The position deviation is converted into a Y-axis thrust command value Fy by a Y-axis compensator (Gy) 208. The compensator (Gy) 208 can include a PID compensator, a low-pass filter, a notch filter, and the like.

A thrust distributor 210 distributes the thrust to the linear motor stators (reaction force counters) XF (125), XB (25), YL (124), and YR (24) on the basis of the X- and Y-direction position command values REF-X and REF-Y, respectively, provided by the position command units 201 and 202. Thrusts Fxb, Fxf, Fyl, and Fyr calculated by the thrust distributor 210 are output to the linear motors XB (25), XF (125), YL (124), and YR (24) through drivers (not shown). Thus, the X- and Y-guide bars 28 and 29 are driven to move the X-Y slider 38.

As described above, the X-Y slider 38 can be controlled by the position feedback servo system, and driven in the X and Y directions in accordance with position profiles independent of each other.

The lower half of FIG. 1 shows the control system of the reaction force counters XF (125), XB (25), YL (124), and YR (24), which serve also as the linear motor stators. The reaction force counters can also be controlled by the position feedback servo system. A description will be made of the reaction force counter XB (25). A subtracter 259 calculates the positional deviation between the position command value (position profile) of the reaction force counter XB (25) provided by a second-order integrator 295 and the measurement position. A compensator 255 converts the calculated position deviation into a thrust command value for the linear motor stator control linear motor 33, and drives the reaction force counter (XB) 25. The reaction force counters (XF) 125, YL (124), and RY (24) are also provided with similar position feedback servo systems, and are driven in accordance with position command values (position profiles) provided by second-order integrators 296 to 298.

Each position feedback servo system can include, e.g., a high speed operation signal processor, such as a DSP (Digital Signal Processor), and be controlled in real time in a softwafer manner at, e.g., a predetermined sampling rate.

A reaction force counter profile generator 270 generates acceleration command values to control the respective reaction force counters XB (25), XF (125), YR (24), and YL (124) in accordance with equations (14) on the basis of the accelerations AccX and AccY and positions X and Y of the X-Y slider 38. The reaction force counter profile generator 270 receives the X- and Y-position command values REF-X (position x) and REF-Y (position y), and X and Y acceleration command values AccX and AccY, of the X-Y slider 38 and outputs acceleration command values AccXB, AccYL and AccYR to be supplied to the respective reaction force counters XB (24), XF (125), YR (24), and YL (124).

The acceleration command values AccX and AccY can be generated by subjecting the X- and Y-position command values REF-X and REF-Y to second-order differentiation sequentially by second-order differentiators 281 and 282. Alternatively, the acceleration command values AccX and AccY can be obtained by detecting the X- and Y-direction accelerations of the X-Y slider 38 by acceleration sensors. The reaction force counter profile generator 270 can include, e.g., a high-speed operation signal processor, such as a DSP (Digital Signal Processor), and be controlled in real time in a softwafer manner at, e.g., a predetermined sampling rate.

The acceleration command values AccXB, AccXF, AccYL, and AccYR generated by the reaction force counter profile generator 270 are subjected to second-order integration by the second-order integrators 295 to 298 to form position command values, and are supplied to the position servo loops of the reaction force counters as position profiles. The respective reaction force counters are driven by the position servo loops in accordance with the supplied position profiles, as described above.

With the above arrangement, even if the driving position profiles of the X-Y slider 38 are given in the X and Y directions independently of each other, the position command values (position profiles) to the reaction force counters are calculated sequentially in accordance with equations (14), so that the X- and Y-direction reaction forces and the moment reaction force can be canceled completely.

Figure 2:
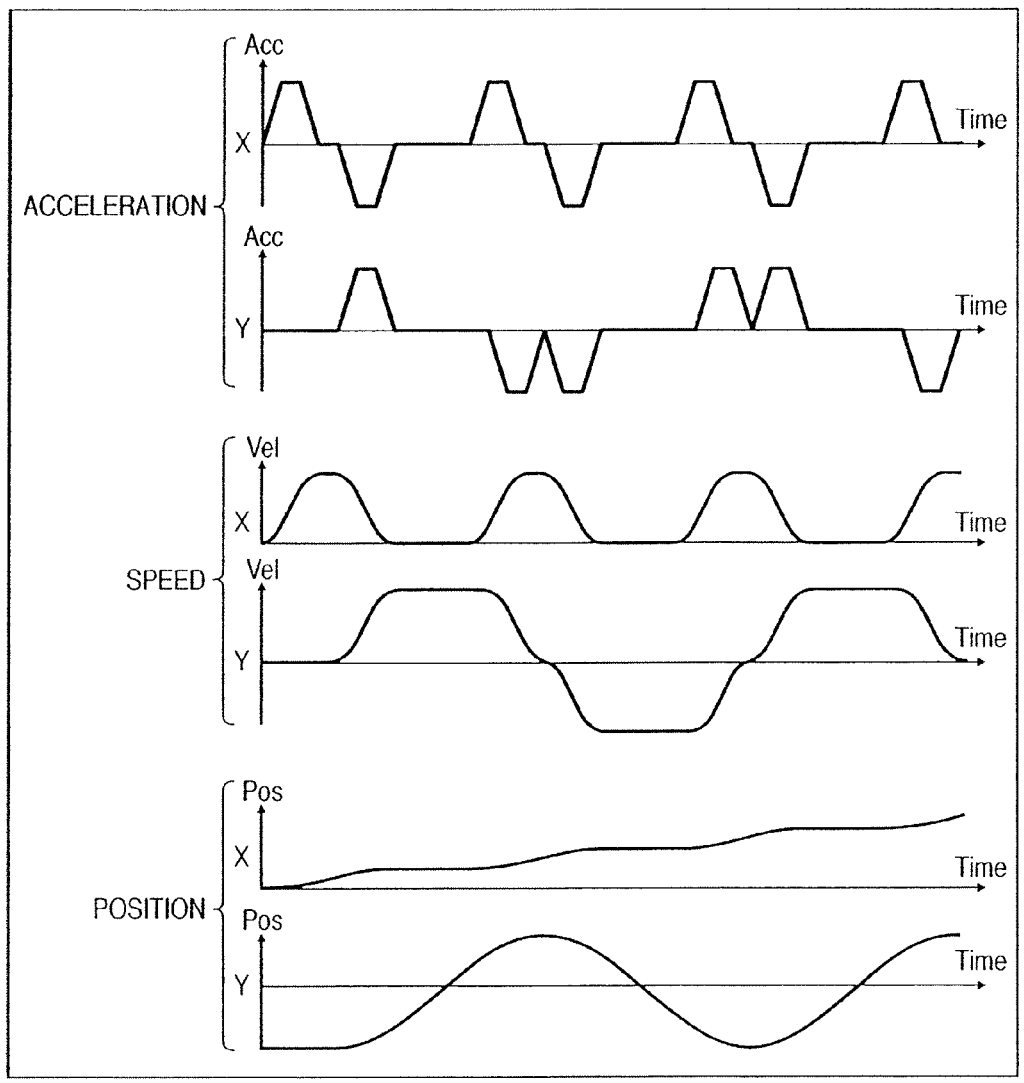
FIG. 2 includes graphs showing an example of a driving pattern, which performs acceleration/deceleration in X and Y directions independent of each other.
Figure 3:
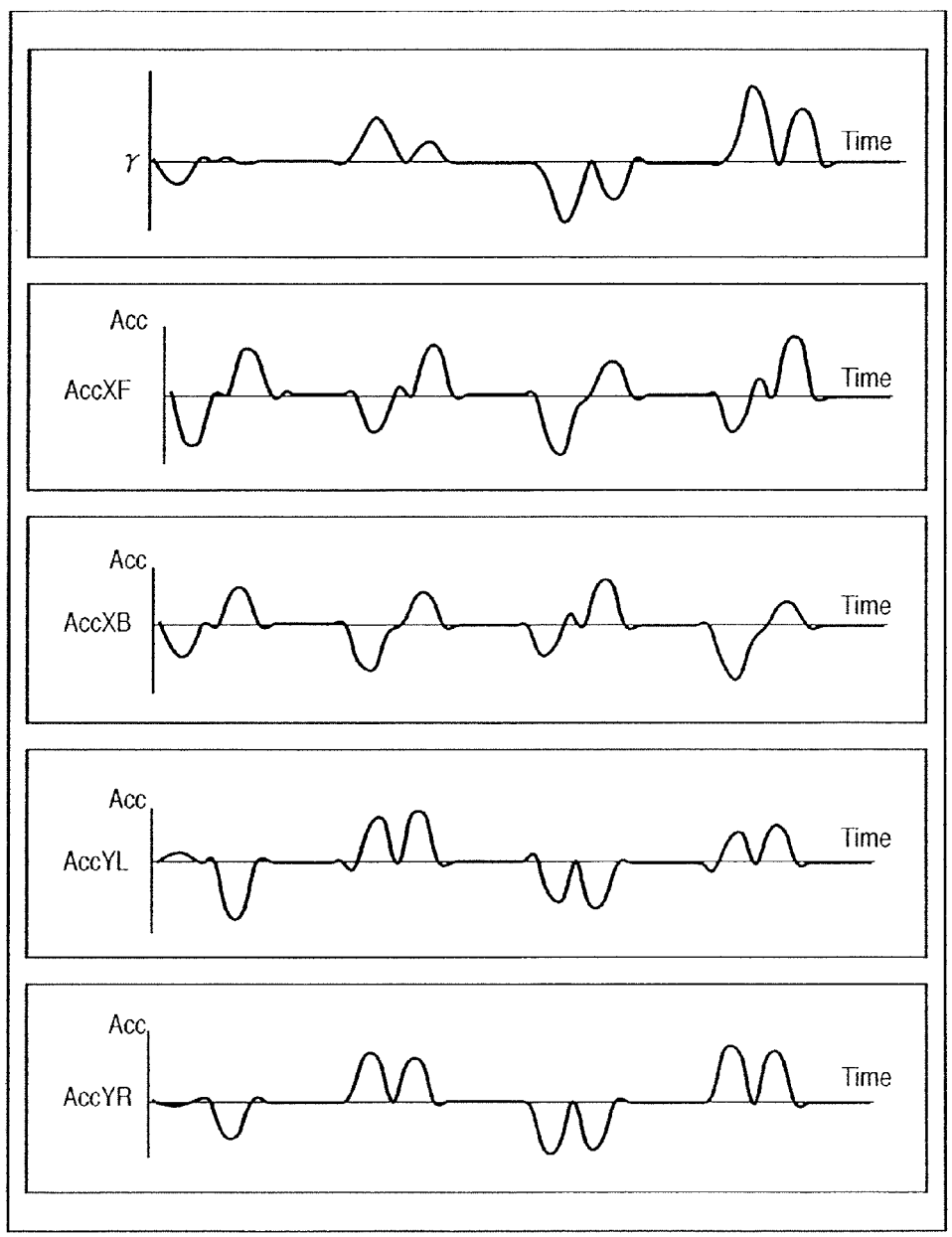
FIG. 3 includes graphs showing an example of an acceleration profile generated by a reaction force counter profile generator.

For example, as shown in FIG. 2, assume a case wherein the X-Y slider 38 is to be continuously driven, such that not only the acceleration (thrust) in the X-axis direction, but, also, the acceleration (thrust) in the Y-axis direction, are to be changed. In this case, the reaction force counter profile generator 270 shown in FIG. 1 generates acceleration profiles, as shown in FIG. 3, in accordance with equations (14). The linear motor stator position control linear motors 133, 33, 132, and 32 drive the reaction force counters XF (125), XB (25), YL (124), and YR (24) in accordance with the generated acceleration profiles, to completely cancel the X- and Y-direction reaction forces and the moment reaction force accompanying the drive of the X-Y slider 38.

Figure 8:
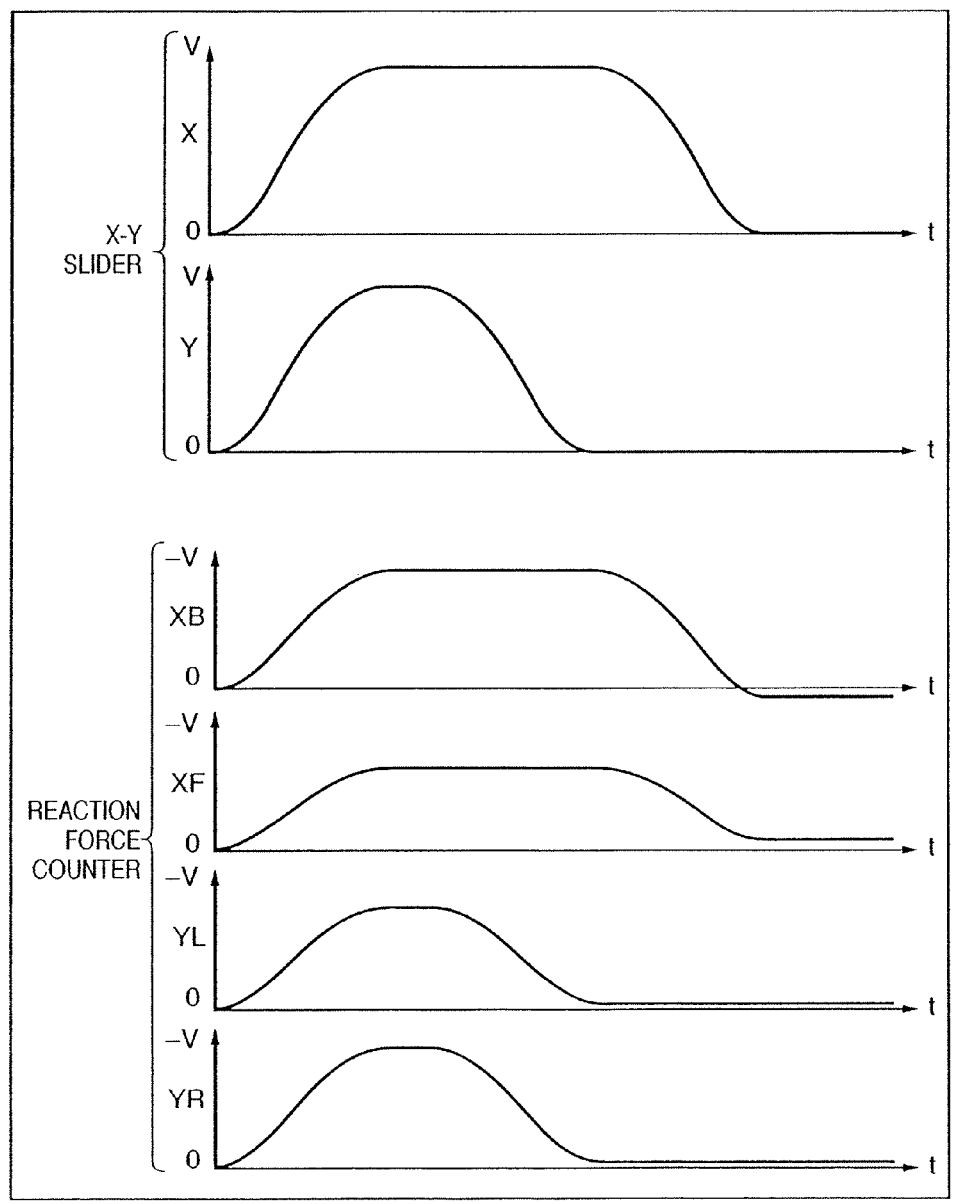
FIG. 8 includes graphs showing examples of the movements of an X-Y slider and a reaction force counter.

While the moment reaction force can be canceled completely, depending on the driving profiles of the X-Y slider 38, even if the X-Y slider 38 stops and its speed becomes zero, the reaction force counters XF (125), XB (25), YL (124), and YR (24) do not become zero in speed, as shown in FIG. 8, but may move at predetermined speeds. In this case, the controller 100 desirably gradually decreases the speeds of the reaction force counters to stop the reaction force counters.

The above technique can be generalized as follows. More specifically, the X-direction reaction force $Fx=m \cdot AccX$, Y-direction reaction force $Fy=m \cdot AccY$, a moment reaction force $Fr=y \cdot Fx-x \cdot Fy=m(y \cdot AccX-x \cdot AccY)$, are sequentially calculated where m, x, and y are the weight, X-direction position, and Y-direction position, respectively, of the X-Y stage, and AccX and AccY are the X- and Y-direction accelerations, respectively, of the X-Y stage. Also, the driving profiles of the reaction force counters are sequentially calculated to establish $\Sigma(FMx)=-Fx$, $\Sigma(FMy)=-Fy$, and $\Sigma(FMr)+-Fr$ such that $\Sigma(FMx)$ is the sum of the thrusts that drive the reaction force counters in the X direction, $\Sigma(FMy)$ is the sum of the thrusts that drive the reaction force counters in the Y direction, and $\Sigma(FMr)$ is the sum of the moment thrusts that drive the reaction force counters. Thus, the respective reaction force counters are driven. Hence, all of the X- and Y-direction reaction forces and the moment reaction force can be canceled completely.

Alternatively, the above technique can also be read in the following manner. More specifically, the driving profiles of the reaction force counters are calculated sequentially to establish $\Sigma(M(i) \cdot AccMX(i))=-Fx$, $\Sigma(M(i) \cdot AccMY(i))=-Fy$, and $\Sigma(J(i) \cdot AccMJ(i))=-Fr$, where $M(i)$ is the weight of each of the plurality of reaction counters, $AccMX(i)$ and $AccMY(i)$ are, respectively, the X- and Y-direction accelerations of each reaction force counter, and $J(i)$ and $AccMJ(i)$ are, respectively, the moment of inertia and the angular acceleration of each reaction force counter. Then, the respective reaction force counters are driven. Hence, all of the X- and Y-direction reaction forces and the moment reaction force can be canceled completely.

Second Embodiment

The control system of the reaction force counter can include a speed servo loop. The acceleration command values AccXB, AccXF, AccYL, and AccYR of the reaction force counters of the first embodiment can be integrated to generate a speed command value profile. The speed command value profile can be used as a profile to control each reaction force counter.

Third Embodiment

The reaction force counter can be controlled by a feed forward control system. For example, thrust command values can be obtained from AccXB, AccXF, AccYL, and AccYR of the first embodiment, and supplied directly (that is, without calculating deviations) to the drivers of linear motors 133, 33, 132, and 32 that drive the reaction force counters.

[Application]

Figure 9:
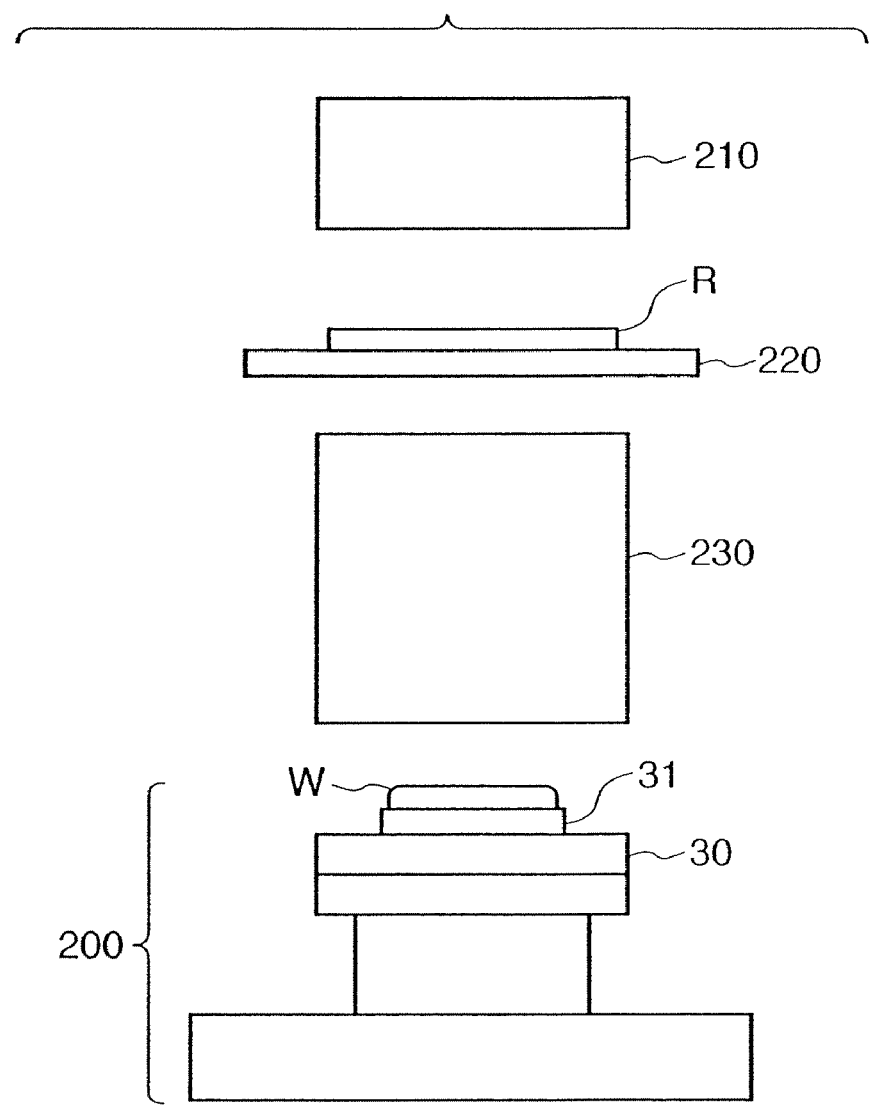
FIG. 9 is a view showing a schematic arrangement of an exposure apparatus.

FIG. 9 is a view showing a schematic arrangement of an exposure apparatus in which the driving apparatus shown in FIGS. 4A and 4B is incorporated as a wafer stage. In the exposure apparatus shown in FIG. 9, a driving apparatus 200 holds a wafer (substrate) W on a wafer chuck 31, and moves the wafer W under the control of a controller 100 in accordance with a position profile.

A reticle (master) R held on a reticle stage 220 is illuminated by an illumination optical system 210, and the pattern of the reticle R is projected onto the wafer W through a projection optical system 230, and exposed. The exposure apparatus can be, e.g., a step and repeat or a step and scan type exposure apparatus.

Figure 6:
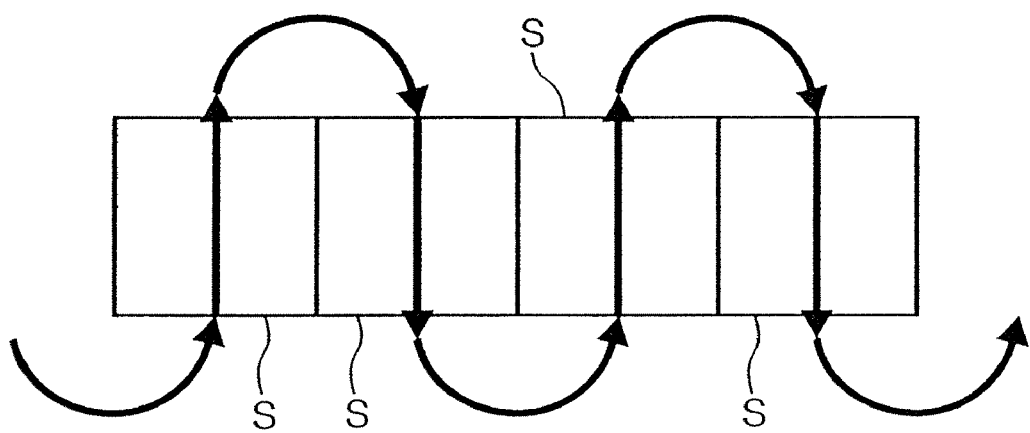
FIG. 6 is a view showing a stage driving example that can improve the throughput.

According to this exposure apparatus, even when the stage (top plate) 30 is driven in accordance with the curved line exemplified in, e.g., FIG. 6, the X- and Y-direction reaction forces acting on the reaction force counter and the moment reaction force, which accompany the drive, can be canceled.

More specifically, according to this exposure apparatus, even when the stage (30) is driven in accordance with the driving profiles that are independent of each other in the X and Y directions, the X- and Y-direction reaction forces and the moment reaction force, which accompany the drive, can be canceled.

Therefore, even when the stage 30 is driven in accordance with the curved line exemplified in, e.g., FIG. 6, vibration and swing accompanying the drive can be decreased. Thus, the overlay accuracy, line width accuracy, and the like, can be improved, while the throughput is improved simultaneously. The influence of the reaction forces accompanying acceleration and deceleration of the stage can be decreased, and the influence on other devices set on the same floor can be decreased. Thus, the effective installation area can be reduced.

According to the exposure apparatus as described above, an excellent device can be manufactured. Such a manufacturing method repeats a lithography process including, e.g., the step of applying a photosensitive agent to a substrate, such as a wafer or glass substrate, the step of transferring or drawing a pattern on the substrate by using the exposure apparatus described above, and the step of developing the pattern, to manufacture a device, such as a semiconductor device, liquid crystal device, and a MEMS device.

As many apparently widely different embodiments of the present invention can be made without departing from the spirit and scope thereof, it is to be understood that the invention is not limited to the specific embodiments thereof except as defined in the appended claims.

What is claimed is:

1. A driving apparatus for moving an object, the apparatus comprising:
    a first actuator which drives the object in X and Y directions;
    a second actuator which drives a plurality of reaction force counters, which receive a reaction force generated when said first actuator drives the object; and
    a controller which calculates X- and Y-direction reaction forces and a moment reaction force on the basis of X- and Y-direction positions of the object and X- and Y-direction accelerations of the object, which are to be received by said plurality of reaction force counters when the object is driven by said first actuator, and controls said second actuator so as to cancel said reaction forces and said moment reaction force.

2. The apparatus according to claim 1, wherein said controller calculates X- and Y-direction accelerations of the object on the basis of the X- and Y-direction positions of the object.

3. The apparatus according to claim 1, further comprising an acceleration sensor which detects X- and Y-direction accelerations of the object.

4. The apparatus according to claim 1, wherein said first actuator includes stators as said reaction force counters.

5. The apparatus according to claim 1, wherein said controller controls said second actuator to gradually decelerate said reaction force counters when speeds of said plurality of reaction force counters are not zero, while a speed of the object is zero.

6. An exposure apparatus comprising a chuck configured to chuck a substrate to be exposed and a driving apparatus configured to drive said chuck, wherein said driving apparatus comprises:
- a first actuator which drives the object in X and Y directions;
- a second actuator which drives a plurality of reaction force counters which receive a reaction force generated when said first actuator drives the object; and
- a controller which calculates X- and Y-direction reaction forces and a moment reaction force on the basis of X- and Y-direction positions of the object and X- and Y-direction accelerations of the object, which are to be received by said plurality of reaction force counters when the object is driven by said first actuator, and controls said second actuator so as to cancel said reaction forces and said moment reaction force.

7. An exposure apparatus comprising a chuck configured to chuck a substrate to be exposed and a driving apparatus configured to drive said chuck, wherein said driving apparatus comprises:
- a first actuator which drives the object in X and Y directions;
- a second actuator which drives a plurality of reaction force counters which receive a reaction force generated when said first actuator drives the object; and
- a controller which controls said second actuator on the basis of X- and Y-direction positions of the object and X- and Y-direction accelerations of the object so as to cancel, by said second actuator, the reaction force to be received by said reaction force counters when the object is driven by said first actuator, wherein said controller calculates X- and Y-direction reaction forces and a rotation-direction reaction force, which are to be received by said reaction force counters when the object is driven by said first actuator, and generates a profile to drive said plurality of reaction force counters on the basis of the X- and Y-direction reaction forces and the rotation-direction reaction force.

* * * * *